United States Patent [19]

Arai et al.

[11] Patent Number: 4,971,832
[45] Date of Patent: Nov. 20, 1990

[54] HR-CVD PROCESS FOR THE FORMATION OF A FUNCTIONAL DEPOSITED FILM ON A SUBSTRATE WITH APPLICATION OF A VOLTAGE IN THE RANGE OF −5 TO −100 V

[75] Inventors: Takayoshi Arai, Nagahama; Masahiro Kanai, Tokyo, both of Japan

[73] Assignee: Canon Kabushiki Kaisha, Tokyo, Japan

[21] Appl. No.: 317,653

[22] Filed: Mar. 1, 1989

[30] Foreign Application Priority Data

Mar. 2, 1988 [JP] Japan .................................. 63-47523

[51] Int. Cl.$^5$ ............................................. B05D 5/12
[52] U.S. Cl. ........................................ 427/39; 427/38; 427/45.1; 118/723; 430/84
[58] Field of Search ..................... 427/38, 39, 45.1; 118/723; 430/84

[56] References Cited

U.S. PATENT DOCUMENTS

| | | | |
|---|---|---|---|
| 4,401,454 | 8/1983 | Matsuo et al. | 427/45.1 |
| 4,461,783 | 7/1984 | Yamazaki | 427/39 |
| 4,522,663 | 6/1985 | Ovshinsky et al. | 427/39 |
| 4,826,778 | 5/1989 | Ishihara | 427/45.1 |

OTHER PUBLICATIONS

Brodsky et al., *IBM Tech. Disc. Bull.*, vol. 22, 8A Jan. 1980, pp. 3391–3392.

*Primary Examiner*—Shrive Beck
*Assistant Examiner*—Margaret Bueker
*Attorney, Agent, or Firm*—Fitzpatrick, Cella, Harper & Scinto

[57] ABSTRACT

An improved process for forming a functional deposited film by HR-CVD method which comprises disposing an electroconductive substrate or an insulating substrate at least one surface of which being applied with electroconductive treatment on a substrate holder in a substantially enclosed film-forming chamber, introducing a precursor formed in an activation chamber disposed separately from the film-forming chamber which is capable of contributing to the formation of the deposited film and an active species formed in another activation chamber disposed separately from the film-forming chamber and the activation chamber which is capable of chemically reacting with the precursor respectively and separately into said film-forming chamber, and chemically reacting them to thereby form a functional deposited film on the substrate, wherein a voltage in the range of from −5 V to −100 V is applied to the electroconductive substrate or the surface of the insulating substrate applied with the electroconductive treatment.

2 Claims, 5 Drawing Sheets

HR-CVD PROCESS FOR THE FORMATION OF A FUNCTIONAL DEPOSITED FILM ON A SUBSTRATE WITH APPLICATION OF A VOLTAGE IN THE RANGE OF −5 TO −100 V

FIELD OF THE INVENTION

The present invention relates to an improved HR-CVD process for the formation of a non-single crystal functional deposited film on a substrate. More particularly, it relates to an improved HR-CVD process for the formation of a non-single crystal silicon-containing functional deposited film on a substrate having an electroconductive surface, which is usable as a constituent member especially for semiconductor devices, photosensitive devices for use in electrophotography, image input line sensors, image pickup devices, photoelectromotive force devices or the like. (The term "non-single crystal film" in the present invention is collectively meant to include an amorphous film (including a microcrystal film) and a polycrystal film.)

BACKGROUND OF THE INVENTION

For the formation of amorphous deposited films such as amorphous silicon-containing deposited film, thermal-induced chemical vapor deposition method, plasma CVD method, CVD method, reactive sputtering method, ion plating method, light-induced CVD method, etc. have been tried. Among these methods, the plasma CVD method has been generally recognized as being the most preferred and it is currently used to manufacture amorphous deposited films on a commercial basis.

However, for any of the known amorphous silicon-containing deposited films, even if it is the one obtained by the plasma CVD method, there are still left subjects to make further improvements not only in overall characteristics in view of electrical and optical properties, fatigue resistance upon repeating use and use-environment characteristics, but also in productivity including filmuniformity and reproducibility and mass-productivity.

Further, the operation conditions to be employed in the formation of an amorphous silicon-containing deposited film by the plasma CVD method are much more complicated than any other known CVD methods and it is extremely difficult to generalize them. That is, there already exist a number of variations even in the correlated parameters concerning the temperature of a substrate, the amount and the flow rate of gases to be introduced, the degree of pressure and the high frequency power for forming a film, the structure of an electrode, the structure of a reaction chamber, the rate of flow of exhaust gases, the plasma generation system, etc. Besides said parameters, there also exist other kinds of parameters.

Under these circumstances, in order to obtain a desirable deposited film product, it is required to choose precise parameters from a great number of varied parameters. Sometimes, serious problems occur. Because of the precisely chosen parameters, a plasma is apt to be in an unstable state. This condition often invites problems in a deposited film to be formed.

And for the apparatus in which the process using the plasma CVD method is practiced, its structure will eventually become complicated since the parameters to be employed are precisely chosen as above stated. Whenever the scale or the kind of the apparatus to be used is modified or changed, the apparatus must be so structured as to cope with the precisely chosen parameters.

In this regard, even if a desirable deposited film should be fortuitously mass-produced, the film product becomes unavoidably costly because (1) a heavy investment is firstly necessitated to set up a particularly appropriate apparatus therefor; (2) a number of process operation parameters even for such apparatus still exist and the relevant parameters must be precisely chosen from the existing various parameters for the mass-production of such film. In accordance with such precisely chosen parameters, the process must then be carefully practiced.

Against this background, there is now an increased demand for a method that makes it possible to practice the process at lower temperatures and at a high film-forming rate in a simple apparatus in order to mass-produce a desirable functional deposited film having a relevant uniformity and having many practically applicable characteristics and such that the product will be relatively inexpensive.

In view of the foregoing situations, a film-forming method different from the plasma CVD method, that is, Hydrogen Radical Assisted Chemical Deposition Method (HR-CVD Method) has been proposed as disclosed in Japanese Patent Laid-Open No. Sho 60-41047. In the HR-CVD method, a precursor capable of contributing to formation of a deposited film which is generated in an activation space (B) disposed separately from a film-forming space (A) for forming the deposited film on the surface of a substrate and an active species capable of chemically reacting with said precursor to cause the formation of a deposited film which is generated in other activation space (C) disposed separately from the activation space (B) are introduced respectively and separately into the film-forming space (A) and they are chemically reacted to thereby cause the formation of a deposited film on the substrate.

FIG. 3 schematically shows a typical constitution of an apparatus suitable for practicing the process of forming a deposited film by the HR-CVD method. In FIG. 3, there are shown a deposition chamber 301 having the film-forming space (A), in which are shown a substrate 303 which is disposed on a substrate holder 302, an electric heater 304 for heating the substrate, material gas reservoirs 305 through 308 and 312, pressure controllers 305a through 308a and 312a for the raw material gases, valves 305(a,b) through 308(a,b) and 312(a,b) for supplying respective raw material gases, mass flow controllers 305(d) through 308(d) and 312(d) for controlling the respective flow rates of the respective raw material gases, gas feed pipes 309 and 313 for introducing the respective raw material gases, a microwave power source 310 for generating microwave energy which is supplied through a waveguide 311 and an applicator provided to surround the outer wall face of a tube made of a dielectric material having an activation space C into the said space in order to convert the raw material gase from the feed pipe 309 into an active species. There are also shown an electric furnace 314 provided with a quartz tube 321 having an activation space B so as to surround the outer wall face of the said quartz tube for converting the raw material gas from the feed pipe pipe 313 into a precursor in the said activation space (B), an exhaust valve 315 provided with an exhaust pipe 316. The precursor formed in the activation space (B) and the active species formed in the activation space (C) are chemically reacted in the film-forming space (A) to thereby form a deposited film on the substrate 303.

The foregoing HR-CVD process for forming a deposited film on a substrate provides various advantages which can not be expected by the known plasma CVD process. For example, a desired deposited film may be formed on a substrate maintained at low temperature without generating plasma in the film deposition space but using an active species from the active species generation space and a precursor from the precursor generation space; and the deposited film formed on the substrate is not affected by any undesirable materials removed from the inner surface of the surrounding wall of the film deposition space and likewise, nor by any residual gases remaining in the film deposition space, which are often found in the known plasma CVD process, since the film deposition space, the active species generation space and the precursor generation space are separate.

However, there still exist the following problems necessary to be solved for the foregoing HR-CVD process that a film once deposited on a substrate will sometimes peeled off in the course of continuing the film-forming operation, this problem often occurs particularly in the case of forming a polycrystalline deposited film; a desired high deposition rate is rarely attained; it is difficult to repeatedly form a desired deposited film having satisfactory characteristics; it often fails to form a desired deposited film when the film-forming conditions are changed aiming at providing desired characteristics for the film to be obtained; and the process control in order to attain mass production of a desired deposited film with reproducibility is difficult.

Accordingly, there is a demand to eliminate the foregoing problems and to improve the aforementioned HR-CVD process so that a desired deposited film having a wealth of many practically applicable characteristics may be effectively and stably formed without occurence of the above problem of film peeling-off at a high deposition rate and such desired deposited film may be repeatedly mass-produced.

SUMMARY OF THE INVENTION

It is, accordingly, a principal object of the present invention to eliminate the above-mentioned problems for the known film-forming process by HR-CVD method and to provide an improved HR-CVD film-forming process capable of stably and efficiently forming a desired non-single crystal functional deposited film at a high deposition rate.

Another object of the present invention is to provide an improved HR-CVD film-forming process for the formation of a desired non-single crystal functional deposited film at high deposition rate, which is capable of easily attaining the simplified control for the film forming conditions and mass production of the films while maintaining the characteristics a film to be formed by effectively causing chemical reaction between a precursor and an active species in a film deposition space for forming a deposited film on a substrate.

A further object of the present invention is to provide an improved HR-CVD film-forming process capable of stably and efficiently forming a polycrystalline functional deposited film having excellent crystallinity.

A still further object of the present invention is to provide an improved HR-CVD process for the formation of a desired silicon-containing non-single crystal deposited film on a conductive surface of a substrate, which is usable as a constituent member especially for semiconductor devices, photosensitive devices for use in electrophotography, image input line sensors, image pickup devices, photoelectromotive force device or the like.

The present invention has been accomplished as a result of extensive studies by present inventors in order to solve the foregoing problems which are found on the known HR-CVD film- forming process and to attain the above-mentioned objects.

The main feature of the improved HR-CVD process for forming a functional deposited film which is provided by the present invention is to conduct film-forming procedures while applying a voltage of from $-5$ to $-100$ V to the surface of an electroconductive substrate to which a deposited film is formed or to the surface of an insulating substrate entirely or partially applied with electroconductive treatment to which a deposited film is formed.

This makes it possible to eliminate the foregoing problems on the known HR-CVD film-forming process and to stably form a desired non-single crystal functional deposited film with good reproducibility and at high deposition rate, and there can be obtained a desired functional deposited film having excellent electrical, optical, opto-electronical and mechanical characteristics. In addition, in the case of forming a polycrystalline functional deposited film, the resulting deposited film will be such that is provided with satisfactory crystallinity of relatively large grain size. Further, it also enables to form a desired deposited film of a uniform film thickness and homogenous film quality to the entire surface even on a large area substrate, as well as it is possible to effectively mass produce the deposited film of such a great area.

These together with other objects, and details of the advantage and features of the present invention will be apparent from the following description of the embodiments of the present invention.

DETAILED DESCRIPTION OF THE INVENTION

The present inventors have made extensive studies for overcoming the foregoing problems on the known HR-CVD process of forming a deposited film and for attaining the objects of the present invention. As a result, the present inventors have obtained a knowledge that the foregoing problems on the known HR-CVD process of forming a deposited film can be solved by applying a voltage of from $-5$ to $-100$ V to an electroconductive substrate to which a deposited film is to be formed or to the electroconductive surface of an insulating substrate at least one of the surfaces thereof being applied with electroconductive treatment.

The present invention has been accomplished based on the above-finding. The gist of the present invention resides in a process for forming a functional non-single crystal deposited film, which comprises: (i) disposing an electroconductive substrate or an insulating substrate at least one surface thereof being applied with electroconductive treatment on a substrate holder in a film-forming space (A); (ii) introducing a precursor as the raw material for forming a deposited film formed in an activation space (B) disposed separately from the film-forming space (A) and an active species formed in another activation space (C) disposed separately from the film-forming space (A) and the activation space (B) which is capable of chemically reacting with the precursor, respectively and separately into the film-forming space (A) and bringing both of them into chemical contact each other, thereby causing the formation of a non-single crystal deposited film on the substrate, wherein a voltage of from $-5$ to $-100$ V is applied to the electroconductive substrate or to the surface of the insulating substrate applied with the electroconductive treatment.

The term "precursor" as used in this invention means a substance which can be a constituent for forming a deposited film, but which does not or can hardly contribute to form said film, as long as it remains in its original energy state.

On the other hand, the term "active species" as used in this invention means such a substance which chemically reacts with the precursor while energizing the precursor to place the precursor in an energy state capable of contributing to the formation of the deposited film.

The following experiments were conducted by the present inventors to obtain the above finding.

Figure 1:
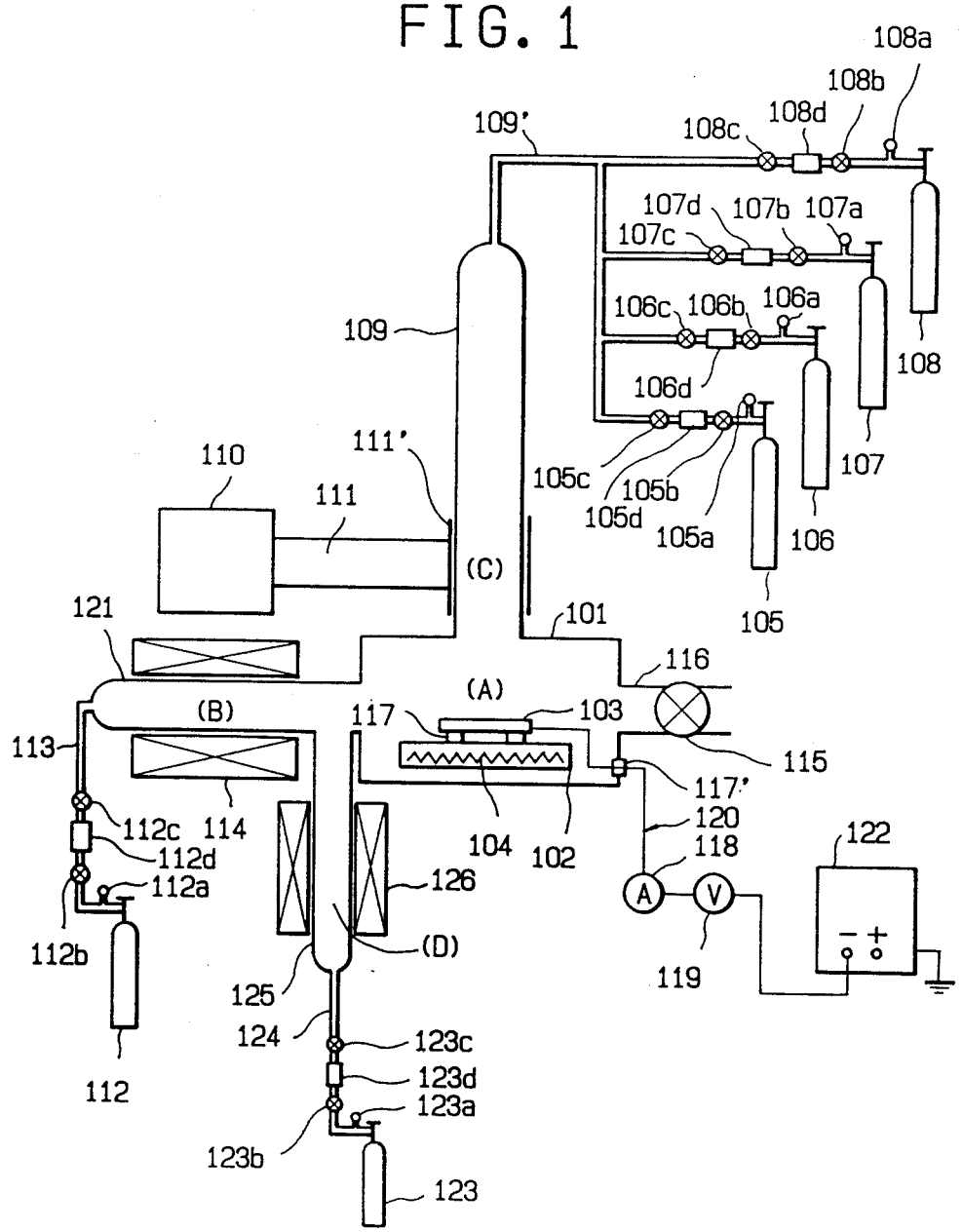
FIG. 1 is a schematic explanatory view illustrating a constitutional example of the apparatus suitable for practicing the HR-CVD film-forming process of the present invention.
Figure 3:
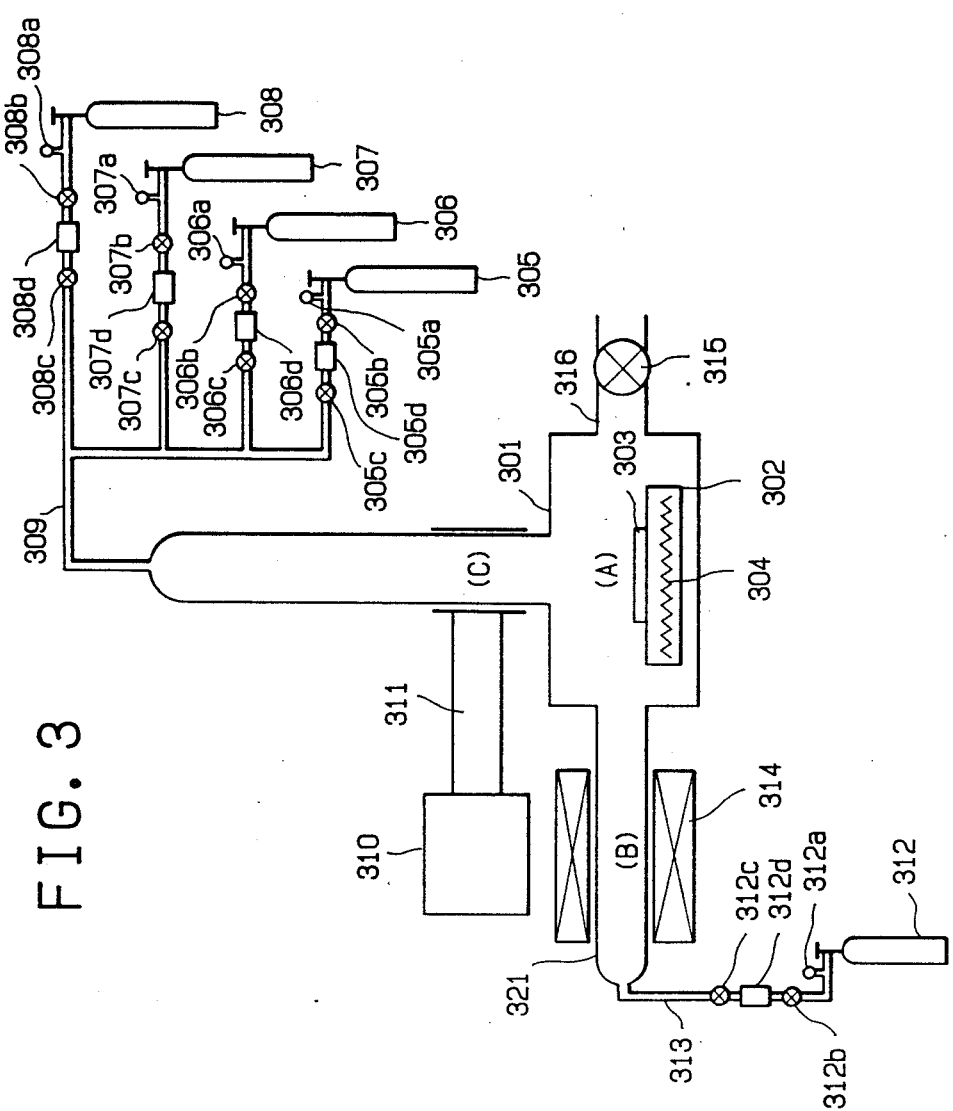
FIG. 3 is a schematic explanatory view illustrating the constitution of the known apparatus for use in practicing the known HR-CVD film-forming process.

In the experiments, the present inventors used an apparatus designed by the present inventors by additionally disposing, to the conventional apparatus shown in FIG. 3 which is suitable for practicing the conventional method for forming a deposited film by HR-CVD process, means for applying a voltage mainly to the surface of a substrate as shown in FIG. 1.

Then, the present inventors have confirmed experimentally that the apparatus shown in FIG. 1 is suitable for practicing the HR-CVD process according to the present invention.

Initially, an explanation is made of the apparatus shown in FIG. 1. In this figure, a film deposition chamber 101 has a film-forming space (A). In the film-forming space (A), a substrate holder 102 having an electric heater 104 for heating the substrate is disposed. An electroconductive substrate 102 comprises a substrate made of insulating material, the surface of which to be formed with a deposited film being partially or entirely applied with electroconductive treatment. The substrate 102 is disposed through an insulating member 117 on the substrate holder 102. A conduction wire 120 is extended from a negative terminal of a DC power source 122, and it is electrically connected with the substrate 103, that is, the surface of an electroconductive substrate or the surface of an insulating substrate applied with electroconductive treatment while being electrically insulated by means of insulators 117' from the peripheral wall of the film deposition chamber 101, so that a negative voltage may be applied to the surface of the substrate to be formed with the deposited film, by which positively charged ion species such as hydrogen ions ($H^+$, $H_2^+$), argon ions ($Ar^+$), helium ions ($He^+$) derived from inert gas (dilution gas), etc. are drawn to the surface. An ampere meter 118 and a volt meter 119 are provided with the conduction wire 120. There are also shown, in the figure, reservoirs 105 through 108 for hydrogen gas, dilution gas (Ar gas, He gas, etc.) and doping raw material gas. A reservoir 112 is for film-forming raw material gas for supplying silicon atoms (Si) and a reservoir 123 for film-forming raw material gas for supplying atoms such as germanium atoms (Ge) and carbon atoms (C). If the raw material for the film-forming raw material gas or doping material gas is liquid or solid in the normal state, means for converting into gases are disposed to the supplying system (not illustrated). Hydrogen gas, dilution gas, doping raw material gas from the reservoirs 105 through 108 are introduced by way of gas feed pipe 109' into the activation chamber 109 having the activation space (C). The respective flow rates of the gases are controlled to desired values by properly controlling the valves (105b, 106, 107b, 108b), mass flow controllers (105d, 106d, 107d, 108d) and valves (105c, 106c, 107c, 108c) disposed to respective feed pipes extended from the reservoirs 105, 106, 107 and 108, as well as by reading the pressure gages (105a, 106a, 107a, 108a). An applicator 111' is disposed to the outer circumferential wall of the activation chamber 109 at the position where the activation space (C) is present for introducing microwave energy, and a waveguide 111 extended from a microwave power source 110 is connected with the applicator 111'. Accordingly, the gases described above introduced into the activation chamber 109 are activated upon reaching the activation space (C) by the action of the microwave energy introduced therein to generate an active species (c) and the thus generated active species (c) is introduced into the film-forming space (A). Further, Si supplying raw material gas from the reservoir 112 is supplied by way of a feed pipe 113 to an activation chamber 121 having an activation space (B). The flow rate of the raw material gas is controlled to a desired value by properly controlling valves 112b and 112c, and a mass flow controller 112d disposed to the feed pipe 113 and by reading the value on the pressure gage 112a. Heating means 114 is disposed so as to surround the outer circumferential wall of the activation chamber 121 where the activation space (B) is situated. As the heating means, electric furnace having heating members such as of nichrome, tantalum and SiC, infrared heating furnace using halogeno lamp, etc. are properly used. Accordingly, the Si supplying raw material gas introduced into the activation space (B) is activated by the action of the heat energy from the heating means 114 to generate a precursor (b) and the thus generated precursor (b) is introduced in the same way for the active species (c)

into the film-forming space (A). Further, raw material gas for supplying atoms such as Ge and C from a reservoir 123 is supplied into an activation chamber 125 having an activation space (D) by way of a feed pipe 124. The flow rate of the raw material gas is controlled to a desired value by properly controlling the valves 123b and the 123c, and a mass flow controller 123d disposed to a feed pipe 124, as well as by reading a pressure gas 123a. An excitation energy generation means 126 is disposed so as to surround the outer circumferential wall of the activation chamber 12 where the activation space (D) is situated. The excitation energy generation means 126 may be used selectively depending on the kind of the material gas and the same means as used for the heating means 114 can be used as the generation means. In addition, electromagnetic energy generation device such as for RF, DC and microwaves, light energy generation device such as for UV, IR, laser beams, etc. may also be mentioned as examples The raw material gas as described above introduced into the activation space (D) is activated by the action of the excitation energy from the excitation energy generation means 126 in the space to generate a precursor (d) and the thus generated precursor (d) is introduced like that the active species (c) into the film-forming space (A). The active species (c) and the precursor (b), or the active species (c), the precursor (b) and the precursor (d) introduced into the film-forming space (A) are maintained at a predetermined temperature, from which positively charged ion species of hydrogen ions ($H^+$, $H_2^+$) or positively charged ion species comprising hydrogen ions and argon ions ($Ar^+$) or helium ions ($He^+$) derived from inert gas (dilution gas) are drawn near the surface of the substrate 103 to which a negative voltage is applied, chemical reaction is caused between the active species and the precursors or between precursors with each other, to cause the formation of a deposited film on the surface of the substrate 103. The film deposition chamber 101 has an exhaust pipe 116 for exhausting the inside of the chamber, that is, the inside of the film-forming space (A), and the exhaust pipe is connected through an exhaust valve 115 to a exhaust device (comprising a rotary pump, a mechanical booster pump and a turbo molecular pump) not illustrated.

EXPERIMENT 1

A plurality of non-doped silicon-containing deposited films were formed by using the deposited film-forming apparatus shown in FIG. 1 and by the following procedures, and the film peeling frequency, the deposition rate and the photosensitivity ratio (ratio of the light electroconductivity ($\sigma p$) upon light irradiation AM-1 100 mW/cm$^2$ to the dark electro-conductivity ($\sigma d$) of the deposited film) were evaluated.

At first, a substrate 103 was prepared by vapor depositing a gap electrode made of Al (50 $\mu$m width, 30 mm length) by the conventional method on a Corning's glass plate No. 7059 (product of Corning Glass Works, U.S.A.), which was placed together with a Si-single crystal wafer of 1 inch diameter on the insulating member 117, and then the inside of the deposition chamber 101 was evacuated to about $10^{-6}$ Torr by way of the exhaust pipe 116. Then, the temperature of the substrate was maintained at 250° C. by actuating the heater 104. Further, the temperature at the surface of the circumferential wall of the activation chamber 121 (made of quartz) was heated to and maintained at 700° C. by the electric furnace 114. Then, various levels of voltages were applied by way of the conduction wire 120 to the substrate 103.

Then, $H_2$ gas was introduced at a flow rate of 30 sccm from the gas reservoir 105, and Ar gas was introduced at a flow rate of 150 sccm from the gas reservoir 106. The inner pressure of the deposition chamber 101 was maintained at 0.3 Torr by controlling the opening of the exhaust valve 115. Then microwave with an effective power of 200 W was applied from the microwave power source 110 through the waveguide 111 and the applicator 111' into the activation space (C). Then, H radicals as the active species generated in the activation space (C) were introduced into the film-forming space (A).

At the same time, $SiF_6$ gas was introduced at a flow rate of 10 sccm from the gas reservoir 112 into the activation chamber 121, and $SiF_2$ radicals generated as the precursor in the activation space (B) were introduced into the film-forming space (A).

Figure 4:
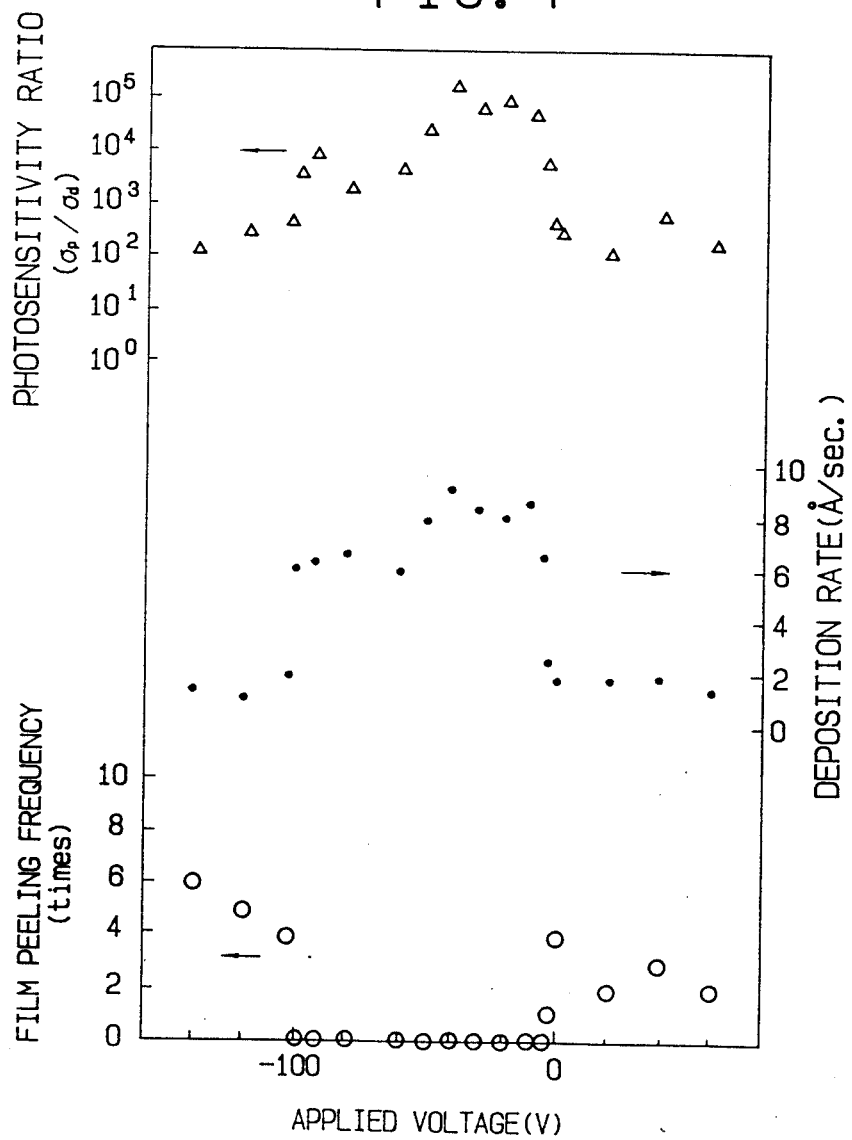
FIG. 4 is a chart collectively showing the results of examining film peeling frequency, deposition rate and photosensitivity ratio on non-doped A-Si(H,X) films which were prepared in accordance with HR-CVD process while varying the voltage applied to the substrate in the present invention.

Thus, a non-depod silicon-containing deposited film of 800 Å thickness was formed on the substrate 103, for which the film peeling frequency, the deposition rate and the photosensitivity ratio were evaluated to obtain the results as shown in FIG. 4. In FIG. 4, there are collectively illustrated the resultant evaluation results for the film peeling frequency, the film deposition rate and the photosensitivity ratio, and the plotted are mean values among 20 specimens prepared for each of applied voltages.

Further, IR absorption spectrum was measured for the film deposited on the Si-single crystal wafer. As the result, the followings have been recognized. That is, for the specimens prepared in the case of setting the voltages in the range of $-10$ to $-50$ V, absorptions were observed at 630 cm$^{-1}$ and 2000 cm$^{-1}$ (belonging to Si-H bond) which has been found to be an absorption pattern inherent to A-Si(H,F) film. For the specimens prepared in the case of setting the application voltages in the range of $-5$ to $-10$ V or in the range of $-10$ to $-100$ V, absorption at 630 cm$^{-1}$ and doublet absorption at 2000 cm$^{-1}$ and 2100 cm$^{-1}$ (belonging to Si-$H_2$ bond) were observed, and it has been found from the resultant absorption patterns that they are partially crystallized with respect to the film quality although they are A-Si(H,F) films. Further, for the specimens for which the application voltage was increased to higher than $-5$ V, and the specimens for which the application voltage was decreased to lower than $-100$ V, the main absorption was the doublet absorption at 2000 cm$^{-1}$ and 2100 cm$^{-1}$ or at 2100 cm$^{-1}$ Further, an absorption peak showing the oxidation (SiO bond) of the film was observed from 1000 to 1100 cm$^{-1}$.

From the results shown in FIG. 4 and the results of measuring IR absorption spectrum described above, it has been found that a desired deposited film with a high photosensitivity ratio can be effectively formed with a high deposition rate and without occurrence of film peeling under the condition of applying an voltage of, preferably, from $-5$ to 100 V and, more preferably, from $-10$ to $-50$ V to the substrate.

EXPERIMENT 2

A plurality of n-type silicon-containing thin films were prepared in the same manner as Experiment 1 using the apparatus shown in FIG. 1, except that the flow rate of $Si_2F_6$ gas was changed to 10 sccm and other film-forming conditions were dependent on the later described Example 2. The voltage applied to the substrate in each case was made as shown in Table 1.

For each of the thus prepared specimens, the crystallinity was observed in accordance with the known reflection high energy electron diffraction (RHEED). As a result, there were obtained the results as shown in Table 1.

As Table 1 illustrates, it is recognized that those n-type silicon-containing thin films obtained with the application of a voltage in the range of −5 to −100 V are polycrystalline since they show spot-like shaped diffraction pattern and (110) orientation, and other n-type silicon-containing thin films obtained with the application of a voltage in the range of less than −100 V or more than −10 V are such that they show ring-like shaped diffraction patterns but do not show any orientation. It is also recognized that those n-type silicon-containing thin films obtained with the application of a voltage in the range of −10 to −50 V are such polycrystalline films that show clearer spot-like diffraction patterns and intense (110) orientation.

On the basis of these results, the present inventors have recognized the following things.

That is, by applying a predetermined degree of a negative voltage to the conductive substrate during the film formation, the amount, etc. of positively charged ions derived from the raw material gas formed with the action of an energy of electric discharge, light, heat or combination of those energies in the activation space (C), for example, hydrogen ions (H+, H+) or argon ions (Ar+), etc. to reach the surface of the electroconductive substrate are properly controlled and as a result, the positively charged ions effectively contribute to promoting mutual contact and chemical reaction of the active species and the precursor causing the formation of a deposited film on the substrate. Because of this, it becomes possible to form a desired deposited film having a wealth of may practically applicable characteristics, being well adhered to the substrate and being accompanied with no problematic internal distortion at a improved deposition rate and without occurrence of film peeling-off which is found on the known HR-CVD film-forming process. And in the case of forming a polycrystalline deposited film, its crystallinity is remarkably improved.

On the other hand, in the case where the application voltage is made lower than −100 V, the amount, etc. of the positively charged ions reaching the electroconductive substrate become excessive, thereby causing such phenomena as film peeling, reduction in the film quality due to ion impact, or incorporation of the positive ions into the film which worsens the film quality.

And in the case where a positive voltage is applied to the substrate, electrons and a little amount of negatively charged ions formed in the activation space (C) reach to the surface of the substrate, no improvement is found in this case with respect to film peeling, deposition rate, photosensitivity ratio, crystallinity, etc. as compared with the case of not applying the voltage at all.

Further, when the foregoing experiment was repeated by using a substrate made of single crystal Si-wafer, etc. which is electroconductive by nature, similar results were also obtained.

It has been found from the foregoing that it is necessary to set the voltage applied to an electroconductive substrate or to the electroconductive surface of an insulating substrate; at least one surface thereof being applied with electroconductive treatment, preferably, from −5 to −100 V, more preferably, from −10 to −50 V for obtaining a desired deposited film.

The present invention of providing an improved HR-CVD process for the formation of a non-single crystal functional deposited film having the foregoing constitution has been accomplished based on the facts found through the foregoing experiments.

Referring to the application voltage in the range of from −5 to −100 V to the electroconductive surface of a substrate upon film-formation, which is the main feature of the present invention, it is desirable to place the substrate on the insulating member 117, electrically connect the conduction wire 120 directly to the substrate and apply a predetermined degree of a voltage from the DC power source 122 in the case where the substrate 103 used is electroconductive. And in the case where the substrate 103 made of electrically insulating material, the surface thereof to be formed with the deposited film is applied with electroconductive treatment by the known method. The conduction wire 120 is electrically connected with the portion applied with the electroconductive treatment and the voltage from the DC power source 122 is applied. In the latter case, disposition of the insulating member 117 may be saved. Further, in the latter case. it is desirable to apply electroconductive treatment to the entire surface of the substrate made of electrical insulating material to be formed with the deposited film. For instance, in the case where a portion of the surface of the substrate has already been applied with electroconductive treatment as in the case of previously forming gap electrodes by means of electroconductive material at the surface of the substrate made of electrically insulating material, a desired deposited film may be formed in the same manner as applying electroconductive treatment over the entire surface. In the case of applying electroconductive treatment to a portion as in the case of disposing the gap electrode described above, the gap width is preferably from 1 to 500 μm, more preferably, from 1 to 250 μm and, optimally, from 1 to 100 μm.

Further, referring to the timing for applying the voltage within the above-mentioned range to the surface of the substrate 103 upon film formation, it is desirable to be applied prior to the introduction of the precursor (b) or (d) from the activation space (B) or (D) into the film-forming space (A). It is desirable that the voltage be applied to the surface of the substrate 103 at least just after the introduction of the active species (c) formed in the activation space (C) into the space (A).

In the process according to the present invention, the precursor (b) from the activation space (B) introduced into the film-forming space (A) is selectively used as desired from those having an average life span, preferably, greater than 0.01 sec, more preferably, greater than 0.1 sec, and the most preferably, greater than 1 sec. The constituent elements of the precursor become the main constituent of a deposited film formed in the film-forming space (A). Further, the active species (c) from the activation space (C) and the precursor (b) from the activation space (B) are introduced into the film-forming space (A) concurrently upon forming a deposited film in the film-forming space (A), and the active species (c) is chemically reacted with the precursor (b) containing the constituent elements to be the main constituent for the deposited film to be formed. As a result, a desired deposited film may be formed on a desired substrate.

The active species (c) from the activation space (C) has an average life span, preferably, of less than 10 sec., more preferably, less than 8 sec. and the most preferably less than 5 sec.

According to the present invention, more stable HR CVD process can be provided by properly controlling the atmospheric temperature and the substrate temperature in the film-forming space (A) as required.

One remarkable feature among others by which the process according to the present invention is clearly distinguished from the conventional CVD process is the use of the active species and the precursor previously generated respectively in the respective activation spaces separately situated from the film-forming space. This results in outstandingly increasing the deposition rate as compared with that in the conventional CVD process and, in addition, in further reducing the substrate temperature upon forming a deposited film, by which a desired deposited film possessing excellent characteristics may be mass-produced on an industrial scale to thereby reduce the cost of a product.

In the present invention, the active species (c), the precursor (b) and the precursor (d) are formed by applying a relevant excitation energy such as electric discharge energy, light energy, heat energy, etc. to the raw material gases in the respective activation spaces. Such energy is usually employed solely but a plurality of such energies can be used in combination. Alternatively, the active species and the precursor may be formed by bringing the raw material gases with an appropriate catalyst or by adding the catalyst.

In the present invention, the active species (c) formed in the activation space (C) are basically H radicals. A typical example of the raw material gas to generate the active species (c) is $H_2$ gas. Other than this, there can be mentioned, as other suitable examples, $SiH_4$, $Si_2H_6$, $SiH_3F$, $SiH_3Cl$, $SiH_3Br$ and $SiH_3I$. Further, these raw material gases can be diluted with an inert gas such as Ar, He gas, etc. upon introduction into the activation space (C).

As the raw material gas to be introduced into the activation space (B) to generate the precursor (b) capable of contributing to the formation of a single-crystal functional deposited film according to the present invention, Si atoms supplying raw material gas is basically used.

Further, as the raw material gas to be introduced into the activation space (D) to generate the precursor (d) capable of contributing to the formation of a single-crystal functional deposited film according to the present invention, raw material gas capable of supplying atoms of Ge, C, N, 0, etc. other than Si atoms is used for instance.

Furthermore, as the raw material to make the resulting film to be of n-type or p-type nature, n-type dopant or p-type dopant supplying raw material gas is used. Such raw material gas is usually introduced into one of the activation spaces (C), (B) and (D) together with the raw material gas to generate the active species (c), the raw material gas to generate the precursor (b) or (d) to be introduced thereinto. However, the n-type dopant or p-type dopant supplying raw material gas may be introduced into other separate activation space (E) via a route different from that for the activation space as described above, applied therein with the activation energy to generate the precursor (e). The thus generated precursor (e) is introduced into the film-forming space (A).

In any of the cases, if the film-forming raw material is not gaseous but liquid or solid, the material may be gasified by known gasifying means and activated to thereby generate the active species or the precursor, which is then introduced into the film-forming space (A).

The film-forming raw material gas described above is to be explained referring to typical examples. Specifically, as the raw material to be introduced into the activation space (B) and activated by the action of the excitation energy to generate the precursor (b), those compounds in which highly electron attractive atoms or atom groups or polar groups are bonded to Si atoms and which are gaseous or easily gasifiable can suitably be used.

As such compound, there can be mentioned: linear silicon halides represented by $Si_uY_{2U+2}$, in which u represents an integer of 1 or greater and Y represents at least one of elements selected from F, Cl, Br and I: cyclic silicon halides represented by $Si_vY_{2v}$ in which v represents an integer of 3 or greater and Y has the same meanings as described above: and linear or cyclic silicon compounds represented by $Si_yH_xY_y$ in which u and Y have the same meanings as described above and $x=y+2u$ or $2u+2$.

Specifically, there can be mentioned those gaseous or easily gasiable compounds, for example, $SiF_4$, $(SiF_2)_5$, $(SiF_2)_6$, $(SiF_2)_4$, $Si_2F_6$, $Si_3F_8$, $SiHF_3$, $SiH_2F_2$, $SiCl_4$, $(SiCl_2)_5$, $SiBr_4$, $(SiBr_2)_5$, $Si_2Cl_6$, $Si_2Br_6$, $SiHCl_4$, $SiH_2Cl_2$, $SiHBr_3$, $SiHI_3$, $Si_2Cl_3F_3$, $Si_2H_3F_3$, $Si_2H_2F_4$, $Si_2H_3Cl_3$, $Si_2H_2Cl_4$, etc.

Such silicon compounds may be used alone or in combination of two or more of them.

As the raw material to be introduced into the activation space (D) and activated by the action of the excitation energy to generate the precursor (d), there can be suitably used those compounds containing Ge, Ce, N, O, etc. as the constituent atoms which are gaseous or easily gasifiable in the same manner as described above.

For instance, as such compound containing Ge as the constituent atoms, there can be mentioned as typical examples linear or cyclic hydrogenated germanium compounds, and those compounds in which hydrogen atoms of the linear or cyclic germanium compounds are partially or entirely substituted with halogen atoms. They are: linear germanium halides represented by $G_uY_{2U+2}$ in which u represents an integer of 1 or greater, Y represents at least one of elements selected from F, Cl, Br and I: cyclic germanium halides represented by $Ge_vY_{2v}$, in which v represents an integer of 3 or greater and Y has the same meanings as described above: and linear or cyclic compounds represented by $Ge_uH_xY_y$ in which u and Y have the same meanings as described above, $x+y=2u$ or $2u+2$.

Specifically, they are those compounds that are gaseous or easily gasifiable, for example, $GeH_4$, $Ge_2H_6$, $GeF_4$, $(GeF_2)_5$, $(GeF_2)_6$, $(GeF_2)_4$, $Ge_2F_6$, $Ge_3F_8$, $GeHF_3$, $GeH_2F_2$, $GeCl_4$, $(GeCl_2)_5$, $GeBr_4$, $(GeBr_2)_5$, $Ge_2Cl_6$, $Ge_2Br_6$, $GeHCl_3$, $GeH_2Cl_2$, $GeHBr_3$, $GeHI_3$, $Ge_2Cl_3F_3$, $Ge_2H_3F_3$, $Ge_2H_3Cl_3$, $Ge_2H_2F_4$, $Ge_2H_2Cl_4$, etc.

As the aforementioned compound containing C as the constituent atoms, linear or cyclic hydrocarbon compounds and those compounds in which hydrogen atoms of the cyclic hydrocarbon compounds are partially or entirely substituted with halogen atoms are used. And there can be mentioned, for example, saturated or unsaturated hydrocarbons represented by $C_nH_{2n+2}$ in which n is an integer of 1 or greater or $C_nH_{2n+1}$ in which n is an integer of 1 or greater $C_nH_{2n}$ in which n is an integer of 1 or greater: linear carbon halides represented by $C_uY_{2u}$ in which u is an integer of 1 or greater and Y is at least one of elements selected from F, Cl, Br and I: cyclic carbon halides represented by $C_vY_{2v}$ in which v is an integer of 3 or greater and Y has the same meanings as described above: and linear or cyclic carbon compounds represented by $C_uH_xY_y$ in which u and Y have the same meanings as described above and $x+y=2u$ or $2u+2$.

Specifically, those compounds which are gaseous or easily gasifiable can be mentioned, for example, $CF_4$, $(CF_2)_5$, $(CF_2)_6$, $(CF_2)_4$, $C_2F_6$, $C_3F_8$, $CHF_3$, $CH_2F_2$, $CCl_4$, $(CCl_2)_5$, $CBr_4$, $(CBr_2)_5$, $C_2Cl_6$, $C_2Br_6$, $CHCl_3$, $CH_2Cl_2$, $CHI_3$, $CH_2I_2$, $C_2Cl_3F_3$, $C_2H_3F_3$, $C_2H_2F_4$, etc.

These carbon compounds may be used alone or in combination of two or more of them.

Likewise, as the compound containing N as the constituent atoms, there can be mentioned typically $N_2$, $NH_3$, $N_2H_5N_3$, $N_2H_4$, $NH_3N_3$, etc.

Further, as the compound containing O as the constituent atoms, there can be mentioned typically those compounds such as $O_2$, $CO_2$, NO, $NO_2$, $N_2O$. $O_3$, CO, $H_2O$, $CH_3OH$, $CH_3CH_2OH$, etc.

These compound containing N as the constituent atoms and the compound containing 0 as the constituents atoms may be used alone or in combination of two or more of them in the respective cases.

The above-mentioned raw material gas to generate the precursor (d) may be introduced into the corresponding activation space after diluted with an inert gas such as Ar, He, etc.

As described above, in the present invention, selected film-forming raw material gases are introduced into the activation space (B), or the activation space (B) and (D), an appropriate excitation energy selected from heat energy, light energy, electric discharge energy, etc. is applied to the raw material gas to form the precursor (b) or the precursors (b) and (d), which are then introduced into the film-forming space (A). In any of these cases, it is desired for the precursor (b) to have a long average life span of greater than 0.01 sec. as described above. The longer the average life span of the precursor, the more the effects of the present invention can be enhanced. That is, in the film-forming space (A), the efficiency of the chemical reaction between the precursor and the active species is enhanced to thereby promote the deposition efficiency and the deposition rat of a film to be formed on the surface of the substrate. In the present invention, when the active species (c) and the precursor (b) or the active species (c) and the precursors (b) and (d) are brought into contact with each other to conduct chemical reaction among them to thereby form a film in the film-forming space (A), heat energy or light energy can be irradiated to the inside of the film-forming space (A) or to the substrate.

In the present invention, the quantitative ratio between the active species (c) and the precursor (b) or the quantitative ratio between the active species (c) and the precursors (b) and (d) introduced into the film-forming space (A) is properly determined depending on the kind, quality, etc. of the film to be formed. In general, the quantitative ratio between the active species (c) and precursor (b), i.e., c:b or the quantitative ratio between the active species (c) and the sum of the precursors (b) and (d) i.e., c:(b+d) is preferably from 10:1 to 1:10, and more preferably from 8:2 to 4:6 on the basis of the ratio of the flow rates introduced.

In the present invention, each of the precursor (b) and the precursor (d) formed in the activation space (B) and the activation space (D) may be composed of a single or a plurality of ingredients. The situation is the same for the active species (c) formed in the activation space (C). In any case, when plural kinds for the precursor (b) or (d) or plural kinds for the active species (c) are used, it is desirable that each of them is formed in a separate activation space and then introduced into the film-forming space (A).

As described above, in the present invention, the film may be doped with an impurity capable of making it to be n-type or p-type. Such doping can be conducted during or after the film formation. In the case of doping the film with a relevant impurity (dopant) during its formation, an n-type dopant or p-type dopant supplying raw material gas is used. Such raw material gas is introduced into one of the activation species (B), (C) and (D) together with a predetermined raw material gas introduced therein and activated to form a precursor (e), which is then introduced into the film-forming space (A). In a preferred embodiment, the n-type dopant or p-type dopant supplying raw material gas is introduced into an independent activation space different from any of the foregoing activation space, applied with an excitation energy to form the active species (e), which is then introduced into the film-forming chamber (A).

As the n-type dopant, elements belonging to the group VA of the periodical table such as N, P, As, Sb, Bi, etc. can be mentioned as preferred examples. Of these elements, P and Sb being the most appropriate.

As the p-type dopant, elements belonging to the group IIIA of the periodical table such as B, Al, Ge, In, Tl, etc. can be mentioned as preferred examples. Of these elements, B and Ge being the most appropriate.

The optimal amount of said dopant used for doping the film is properly determined depending on electric and optical characteristics desired for the film to be formed.

As the dopant supplying raw material, those compounds containing the foregoing group V A or group III A elements as their constituents which are gaseous at a normal temperature and normal pressure or easily gasifiable at least under the film-forming conditions can be mentioned.

As specific examples for such compounds, there can be illustrated, for example, $PH_3$, $P_2H_4$, $PF_3$, $PF_5$, $PCl_3$, $AsH_3$, $AsF_3$, $AsF_5$, $AsCl_3$, $SbH_3$, $SbF_5$, $BiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$, etc.

These compounds may be used alone or in combination of two or more of them.

The substrate for use in the present invention may either be electroconductive or electrically insulating.

As the electroconductive substrate, there can be mentioned, for example, metals such as NiCr, stainless steels, Al, Cr, NO, Au, Ir, Nb, Ta, V, Ti, Pt, Pd, etc. or alloys thereof.

The electrical insulating substrate can include, for example, films or sheets of synthetic resins such as polyester, polyethyelen, polycarbonate, cellulose acetate, polypropylene. polyvinyl chloride, polyvinylidene chloride, polystyrene and polyamide, glass, ceramic, paper, etc. The electrical insulating substrates is applied with electroconductive treatment at least to one of the surfaces thereof and disposed with a film on thus treated surface.

In the case of glass, for instance, the surfaces is applied with electroconductive treatment by disposing a thin film such as of Ar, Cr, Mo, Au, Ir, Nb, Ta, V, Ti, Pt, Pd, $In_2O_3$, $SnO_2$, ITO($In_2O_3+SnO_2$). etc. In the case of synthetic resin such as of polyester film, the surface is applied with electroconductive treatment by the treatment with metal such as NiCr, Al, Ag, Pb, Zn, Ni, Au, Cr, Mo, Ir, Nb, Ta, V, Ti, Pt by means of vacuum deposition, electron beam deposition, sputtering, etc. or by the lamination with the metal described above.

The above-detailed HR-CVD process according to the present invention is effective for the preparation of various types of semiconductor devices, photosensitive devices for use in electrophotography, image input line sensors, image pickup devices, photoelectromotive force devices, etc.

Figure 2:
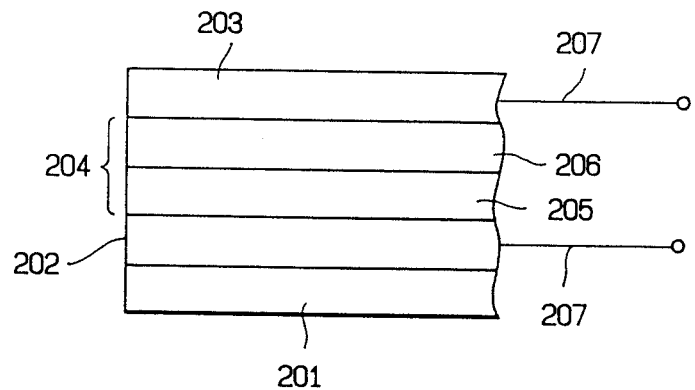
FIG. 2 is a schematic cross-sectional portion view illustrating a pn-type diode prepared in accordance with the HR-CVD film-forming process of the present invention.
Figure 5:
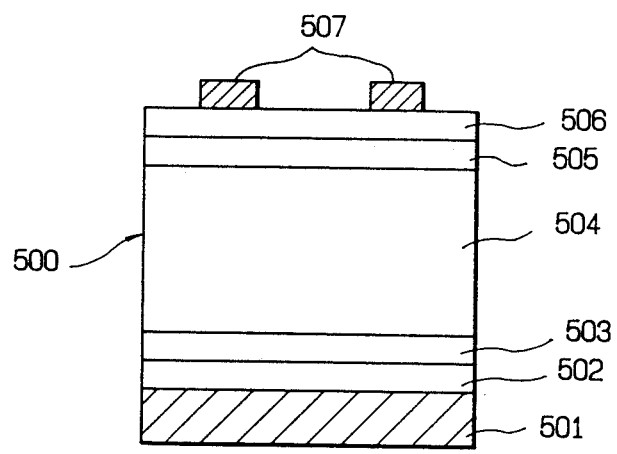
FIG. 5 is a schematic cross-sectional portion view illustrating a photoelectromotive force element prepared in accordance with the HR-CVD film-forming process of the present invention.

Specifically in this respect, there can be mentioned a PN-type diode device as shown in FIG. 2 and a pin type photoelectromotive force device as shown in FIG. 5.

That is, the PN type diode device exemplified in FIG. 2 has a deposited polycrystalline Si film formed by the process for forming a deposited film by the HR-CVD method according to the present invention as the constituent element member.

In FIG. 2, are shown a substrate 201, thin film electrodes 202, 203, a semiconductor layer 204, an N-type semiconductor layer 205, a P-type semiconductor layer 206, and a conduction wire 207 connected with an external electric circuit device.

The thin film electrodes 202, 203 are obtained, for example, by disposing thin films of NiCr, Al, Cr, Mo, Au, Ir, Nb, Ta, V, Ti, Pt, Pd, $In_2O_3$, $SnO_2$, ITO($In_2O_3+SnO_2$) on the substrate 201 and on the semiconductor layer 204 respectively by means of vacuum deposition, electron beam deposition, sputtering or like other treatment. The thickness for each of the electrodes 202, 203 is, preferably, $30-5\times10^4$ Å and, more specifically, $10-5\times10^3$ Å.

When providing the constituent film for the semiconductor layer 204 of polycrystalline Si(H,X) with n or p type nature as required n-type impurity and/or p-type impurity are doped into the layer to be formed under control for the amount thereof upon forming the layer. For forming n-type or p-type crystalline (polycrystalline Si(H,X) layer, a precursor containing silicon and halogen is introduced into the film-forming space (A) by the process according to the present invention, and film-forming chemical material introduced into the activation space (C) and inert gas and compounds containing impurity elements as the ingredient are respectively excited and decomposed by activation energy to form respective active species, which are separately or after properly mixing introduced into the film-forming space (A) in which the substrate 201 is disposed and the deposited film is formed on the substrate 201 by the chemical reaction between the active species and the precursor containing silicon and halogen.

FIG. 5 is a schematic cross sectional portion view illustrating a typical embodiment of a pin type photoelectromotive force device in which a non-single crystal film formed by the HR-CVD process according to the present invention is used as the constituent semiconductor layer. That is, in this embodiment, non-doped, p-type and n-type non-single crystal films i.e., A-Si:C:F film, A-SiGe:H:F film, A-SiC-H-F film, etc. formed by the process for forming the deposited film by the HR-CVD process according to the present invention are used.

In the figure, there are shown a substrate 501, a lower electrode 502, an n-type semiconductor layer 503, an i-type semiconductor layer 504, a p-type semiconductor layer 505, a transparent electrode 506 and collector electrodes 507 in which light is applied on the side of the transparent electrode 506.

The substrate 501 may be electroconductive or electrically insulating. As specific examples of them, there can be mentioned metals such as Fe, Ni, Cr, Al, Mo, Au, Nb, Ta, V, Ti, Pt, Pb, etc., or alloys thereof, for example, brass, stainless steels, etc.

In addition, films or sheets of synthetic resins such as of polyester, polyethylene, polycarbonate, cellulose acetate, polypropylene, polyvinyl chloride, polyvinylidene chloride, polystyrene, polyamide, polyimide, etc., glass, ceramics, etc. can be mentioned.

The lower electrode 502 may not be disposed in a case where the substrate 501 is electroconductive but it should always be disposed in a case where the substrate is electrically insulating. The lower electrode 502 is disposed for the purpose of applying surface electroconductive treatment to the electrically insulating substrate and for the purpose of serving as a low resistance electrode for taking out electrical current in a cas where the sheet resistance value of the substrate 501 is high if it is electroconductive or increasing the reflectance at the substrate surface to effectively utilize the incident light.

As the electrode material, there can be mentioned metals such as Ag, Au, Pt, Ni, Cr, Cu, Al, Ti, Zn, Mo and W or alloys thereof. A thin film of these metals is formed by means of vacuum deposition, electron beam deposition, sputtering, etc. It is necessary to take a consideration so that the thin metal film formed does not constitute a resistive ingredient to the output of the photoelectromotive force device and the sheet resistance value is, preferably, less than 50 ohm and, more preferably, less than 10 ohm. The transparent electrode 506 desirably has light transmittance of higher than 85% so that light from the sun or white fluorescent lamp, etc. can efficiently be absorbed into the semiconductor layer. Further, it is electrically desirable that the sheet resistance value is less than 100 ohm so that it does not constitute an electrically resistive ingredient to the output of the photoelectromotive force device. As materials having such characteristics, there can be mentioned metal oxides such as $SnO_2$, $In_2O_3$, ZnO, CdO, $Cd_2SnO_4$, ITO($In_2O_3+SnO_2$), etc. and thin metal films prepared from metals such as Au, Al, Cu, etc. formed into an extremely thin film thickness and in a semi-transparent state. Ohmic heating, vapor deposition, electron beam heating, vapor deposition, sputtering, spray. etc. can be used as a method of manufacturing them and they can be selected properly depending on the requirements.

The member 507 is disposed on the transparent electrode 506 with an aim for reducing the surface resistance value of the transparent electrode 506. As the electrode material, there can be mentioned metals such as Ag, Cr, Ni, Al, Ag, Au, Ti, Pt, Cu, Mo and W or thin films of the alloys thereof. The thin films may be used in lamination. Furthermore, for ensuring the sufficient light amount incident to the semiconductor layer, the shape and the area are properly designed.

For instance, it is desired that the shape is uniformly extended toward the photoreceiving surface of the photoelectromotive force device and the area is, preferably, less than 15% and, more preferably, less than 10% relative to the photoreceiving area.

Further, it is desirable the sheet resistance value is, preferably, less than 50 ohm and more, preferably, less than 10 ohm.

DESCRIPTION OF THE PREFERRED EMBODIMENTS

The invention will be described more specifically while referring to Examples 1 through 8, but the invention is not intended to limit the scope only to these examples.

EXAMPLE 1 p-type, n-type and non-doped A-Si(H,X) deposited films were formed using the apparatus shown in FIG. 1 and in accordance with the procedures as will be described below.

At first, an Al substrate 103 was placed on the ceramic insulator 117 and the inside of the deposition chamber 101 was evacuated to about $1 \times 10^{-6}$ Torr through the exhaust pipe 116 by operating the exhaust device comprising rotary pump, mechanical booster pump and turvo molecular pump.

Then, the substrate was heated to 250° C. and maintained at this temperature by means of the electric heater 104. The activation chamber 121 comprising quartz tube was heated by the electric furnace 114 to 700° C. for the surface temperature and maintained at this temperature.

While maintaining the substrate temperature and the surface temperature of the quartz tube as described above, a DC voltage of $-30$ V reading on the voltage meter 110 was applied to the Al substrate 103. Then, H$_2$ gas from the reservoir 105 and Ar gas from the reservoir 106 were introduced through the activation chamber 109 into the deposition chamber 101 at the respective flow rates of 30 sccm and 150 sccm. And the pressure in the film deposition chamber was kept at 0.3 Torr by controlling the opening of the exhaust valve 115. Then, microwave of an effective power of 200 W from the microwave power source 110 was applied into the activation chamber 109 to generate H radicals as the active species in the activation space (C), which were introduced into the film-forming space (A).

At the same time, Si$_2$F$_6$ gas from the reservoir 112 was introduced through the activation chamber 121 into the deposition chamber 101 at a flow rate of 30 sccm to generate SiF$_2$ radicals as the precursor in the activation space (B), which were introduced into the film-forming space (A).

Thus, a non-doped A-Si:H:F film of 2000 Å in thickness was formed on the Al substrate 103.

Separately, a p-type A-SI:H:F film of 2000 Å in thickness was formed on a separate Al substrate in the same manner as that for forming the non-doped A-Si:H:F film as described above, except that BF$_3$ diluted to 300 ppm with Ar gas from the gas reservoir 107 was additionally introduced through the activation chamber 121 into the deposition chamber 101 at a flow rate of 10 sccm.

Further, an n-type A-Si:H:F film of 2000 Å in thickness was prepared on a separate Al substrate in the same manner as that for forming the non-doped A-Si:H:F film as described above, except that PH$_3$ diluted to 300 ppm with Ar gas from the reservoir 108 was additionally introduced through the activation chamber 121 into the deposition chamber 101 at a flow rate of 10 sccm.

The above formations of the non-doped, p-type, n-type A-Si:H:F films were repeated 20 times, for each case. And the film-peeling frequency, deposition rate and photosensitivity ratio were examined on the resultant samples. The results obtained were as shown in Table 2.

COMPARATIVE EXAMPLE

Non-doped, p-type and n-type A-Si:H:F films were prepared to obtain 20 samples for each film in the same manner as in Example 1, except the apparatus shown in FIG. 3 was used and not any voltage was applied to the substrate 303. The resultant samples were examined in the same way as in Example 1. The results obtained were as shown in Table 3. From the results shown in Table 3, it has been found that when the voltage is not applied to the substrate, the film peeling quite often occurs, the value for the deposition rate is remarkably low, and the photosensitivity ratio is distinguishably small as compared with the case of Example 1.

EXAMPLE 2 n-type polycrystalline thin Si film were formed using the apparatus shown in FIG. 1.

At first, H$_2$ gas was introduced at a flow rate of 100 sccm from the gas reservoir 105, Ar gas was introduced at a flow rate of 150 sccm from the gas reservoir 106 and PH$_3$ diluted to 300 ppm with Ar was introduced at a flow rate of 10 sccm from the gas reservoir 108, and the pressure at the inside of the film deposition chamber was kept at 0.3 Torr by controlling the opening of the exhaust valve 115. Microwave power of an effective power of 400 W was charged from the microwave power source 110 into the activation space (C). The H radicals as the active species formed in activation space (C) were introduced into the film deposition space (A).

Simultaneously, Si$_2$F$_6$ gas was introduced at a flow rate of 30 sccm from the gas reservoir 112 into the quartz tube 121. The SiF$_2$ radicals as the precursor formed in the activation space (B) were introduced into the film-forming space (A).

In this way, an n-type polycrystalline thin Si film of 2000 Å in thickness was formed on the Al substrate in the same manner as in Example 1 for preparing the n-type A-Si:H:F film, except for increasing the flow rate of H$_2$ gas used and increasing the microwave power charged to the activation space (C).

The above procedures were repeated 20 times to obtain 20 n-type polycrystalline thin films samples. The resultant samples were examined in the same way as in Example 1. The results obtained were as shown in Table 4.

Further, the crystallinity was evaluated for each of the n-type polycrystalline thin film samples by RHEED. As a result, spot-like diffraction pattern of (110) face orientation was obtained, and the average grain size was 1 pm (Observed points: 10 points for one thin film specimen: a mean value for 10 points $\times$ 20 specimens = 200 points).

EXAMPLE 3

A PN diode shown in FIG. 2 was prepared using the apparatus shown in FIG. 1.

At first, a polyethylene naphthalate film 201 vapor deposited with a 500 Å thick TIO film 202 by means of the conventional method was placed as the substrate 103 on the substrate holder 102. An n-type polycrystalline thin Si silm 205 of 1000 Å in thickness was formed on the ITO film 202 by the same manner as in Example 2.

Then, a p-type polycrystalline thin Si film 206 of 1000 Å in thickness was formed on the n-type polycrystalline thin Si film 205 in the same manner as in the above case of forming the n-type polycrystalline thin Si film, except for not introducing PH but introducing $PF_3$ diluted to 300 ppm with Ar gas at a flow rate of 10 sccm from the gas reservoir 107. Further, a 500 Å thick Al electrode 207 was formed on the p-type polycrystalline thin film by means of the known vapor deposition method, to thereby obtain a PN-type diode.

For the resultant PN-type diode device (1 $cm^2$ area), its I-V characteristics were examined to evaluate its rectification characteristics. As a result, the rectification ratio of the diode at a voltage of 1 V showed satisfactory value of $2 \times 10^3$ and the n value of the diode was 1.25.

EXAMPLE 4

Twenty kinds of n-type polycrystalline thin Si film samples were prepared by using the apparatus shown in FIG. 1. In each case, twenty n-type polycrystalline thin Si film specimens were prepared in the same manner as in Example 2, except for changing the voltage applied to the Al substrate 103 as shown in Table 5. The same measurement and evaluation as those in Example 2 were conducted for the resultant specimens. The results obtained were as shown in Table 5. It has been found from the results shown in Table 5 that the films showed no film-peeling. And there were observed a satisfactory deposition rate and photosensitivity ratio. Further, spot-like diffraction images were observed by RHEED. In addition, it has been found and that all the n-type polycrystalline thin Si films are of a large average grain size and of a satisfactory crystallinity.

EXAMPLE 5

Five kinds of PN-type diodes shown in FIG. 2 were prepared by using apparatus shown in FIG. 1. In each case, the same procedures as in Example 3 were repeated except for changing the voltage applied to the ITO film 202 as the thin film electrode to: −40 V, −10 V, −20 V, −5 V or -50V. The same measurement and evaluation as those in Example 3 were conducted for the resultant five PN-type diode samples. The results obtained were as shown in Table 6.

As apparent from the results shown in Table 6, it has been found that all the resultant diodes are of a high rectification ratio and have an excellent n value.

EXAMPLE 6

A pin-type photoelectromotive force device 500 shown in FIG. 5 was prepared using the apparatus shown in FIG. 1.

In FIG. 5, there are shown a conductive substrate 501, a lower electrode 502, an n-type semiconductor layer 503, an i-type semiconductor layer 504, a p-type semiconductor 505, a transparent electrode 506 made of a transparent conductive film and a collector electrode 507.

At first, an n-type A-Si:H:F film was deposited to a film thickness of 500 Å as the n-type semiconductor layer 503 on the substrate except for placing a SUS substrate 501 on which a thin Ag film of 2000 Å thickness had been deposited by means of the sputtering method as the lower electrode 502 and applying a DC voltage of −40 V to the substrate by way of the conduction wire 120. An intrinsic A-Si:H:F film was deposited to a film thickness of 500 Å as the I-type semiconductor layer 504 on the previously formed n-type A-Si:H:F film in the same procedures as those in Example 1 except for once discharging the raw material gas used for forming the n-type semiconductor layer and evacuating the inside of the film-forming space (A) to about $1 \times 10^{-6}$ Torr and, thereafter, applying DC voltage of −40 V to the substrate 501 again. Then, a p-type A-Si:H:F film was deposited to a film thickness of 150 Å as the p-type semiconductor layer 505 on the i-type A-Si:H:F film by the same procedures as those in Example 1 except for once discharging the raw material gas used for forming the i-type semiconductor layer again, evacuating the inside of the film-forming space (A) to about $1 \times 10^{-6}$ Torr and then applying DC voltage of −40 V to the substrate 501.

In this way, the substrate 501 on which three types of layers had been laminated was cooled, taken out of the system and set to a known sputtering device, and an ITO film was laminated to a thickness of 600 Å as the transparent electrode 506 on the p-type A Si:H:F film.

Further, the substrate 501 formed with the transparent electrode 506 was taken out of the sputtering device and a permalloy mask for forming the collector electrode pattern was closely bonded to the upper surface of the transparent electrode 506. They were set to a known vacuum deposition device and a thin Ag film was vapor deposited to a film thickness of 0.8 um by means of ohmic heating method to form a comb-line collector electrode 507 thereby prepare the photoelectromotive force device 500.

AM-1.5 light (100 mW/$cm^2$) was irradiated on the side of the transparent electrode 506 of the thus formed photoelectromotive force device to measure the initial value for the open voltage (Voc) and the short circuit current (Isc) and, further, the variation coefficients for Voc and Isc were evaluated after continuous light irradiation for 10 hours.

As a result, initial Voc was 0.92 V, the initial Isc was 15.7 mA/$cm^2$, and the variation coefficient from the initial values for the Voc and Isc after the continuous 10 hours' light irradiation were within 5%. From the results, it has been found that the photoelectromotive force device prepared by the process for forming the deposited film according to the present invention stable characteristics of had high Voc and Isc and with less photodegradaiton.

EXAMPLE 7

A pin-type photoelectromotive force device 500 shown in FIG. 5 was prepared using the apparatus as shown in FIG. 1. The procedures were the same as those in Example 6 up to the step of forming the n-type A-Si:H:F film as the n-type semiconductor layer 503.

Then, after discharging the raw material used for forming the n-type semiconductor layer and evacuating the inside of the film-forming space (A) to about $1 \times 10^{-6}$ Torr and a DC current at −40 V read on the volt meter 119 was applied to the substrate 501. Then, $H_2$ gas was introduced at a flow rate of 40 sccm from the gas reservoir 105 and the Ar gas was introduced at a flow rate of 120 sccm from the gas reservoir 106 respectively, and the pressure in the film-forming space (A) was kept to 0.2 Torr by controlling the opening degree of the exhaust valve 115. Microwave at an effective power of 200 W was charged from the microwave power source 110 by way of the waveguide 111 into the activation space (C). Thus, H radicals, etc. as the active species formed in the activation chamber (C) were introduced into the film-forming space (A).

At the same time, $Si_2F_6$ gas was introduced at a flow rate of 30 sccm from the gas reservoir 112 into the quartz tube 121 heated and maintained at 700° C. and $SiF_2$ radicals as the precursor formed in the activation space (B) wer introduced into the film-forming space (A).

Further, $GeF_4$ gas was introduced at a flow rate of 3 sccm from the gas reservoir 123 into the quartz tube 125 charged with Ge particles and heated and maintained at 450° C by means of the electric furnace 126, and $GeF_2$ radicals as the precursor formed in the activation space (D) were introduced into the film-forming space (A).

In this way, an i-type A-SiGe:H:F film as the i-type semiconductor layer was formed to a film thickness of 4000 Å on the n-type A-Si:H:F film.

Successively, the p-type semiconductor layer 505, the transparent electrode 506 and the collector electrode 507 were formed in the same procedures as those in Example 6 to prepare the photoelectromotive force device 500, and the characteristics as the photoelectromotive force device were evaluated in the same way as those conducted in Example 6.

As a result, the initial values were 0.71 V for Voc and 21.5 mA/cm$^2$ for Isc, and the variation coefficients the initial values for Voc and Isc after the continuous 10 hours' light irradiation were within 5%. From the results, it has been found that the photoelectromotive force device prepared by the process for forming the deposited film according to the present invention had stable characteristics of high Voc and Isc and with less photodegradation.

EXAMPLE 8

A pin-type photoelectromotive force device 500 shown in FIG. 5 was prepared using the apparatus shown in FIG. 1. The procedures were the same as those in Example 6 up to the step of forming the n-type A-Si:H:F film as the n-type semiconductor layer 503.

Then, after once discharging the raw material gas used for forming the n-type semiconductor layer and evacuating the inside of the deposition space (A) to about $1 \times 10^{-5}$ Torr, a DC voltage at $-10$ V read on the volt meter 119 was applied to the substrate 501. Then, $H_2$ gas was introduced at a flow rate of 50 sccm from the gas reservoir 105 and Ar gas was introduced at a flow rate of 100 sccm from the gas reservoir 106 respectively, and the pressure in the deposition chamber was kept to 0.1 Torr by controlling the opening degree of the exhaust valve 115. Microwave at an effective power of 250 W was charged from the microwave power source 110 by way of the waveguide 111 into the activation space (C). Thus, H radicals, etc. as the active species formed in the activation space (C) were introduced into the film-forming space (A).

At the same time, $Si_2F_6$ gas was introduced at a flow rate of 25 sccm from the gas reservoir 112 into the quartz tube 121 heated and maintained at 700° C., and $SiF_2$ radicals as the precursor formed in the activation space (B) were introduced into the film-forming space (A).

Further, $CF_4$ gas was introduced at a flow rate of 5 sccm from the gas reservoir 123 into the quartz tube 125, and RF power at 50 W was charged from the RF power source 126, and $CF_2$ radicals as the precursor formed in the activation space (D) were introduced into the film-forming space (A).

In this way, an i-type A-SiC:H:F film was deposited to a film thickness of 4500 Å as the i-semiconductor layer on the n-type A-Si:H:F film.

Successively, after once discharging the raw material gas used for forming the i-type semiconductor and evacuating the inside of the film-forming space (A) to about $1 \times 10^{-6}$ Torr, a DC voltage at $-150$ V was applied to the substrate 501. Then, $H_2$ gas was introduced at a flow rate of 70 sccm from the gas reservoir 105, Ar gas was introduced at a flow rate of 120 sccm from the gas reservoir 106 and $BF_3$ diluted to 1000 ppm with Ar was introduced at a flow rate of 8 sccm from the gas reservoir 107 respectively, and the pressure in the film-forming space (A) was maintained to 0.5 Torr by controlling the opening degree of the exhaust valve 115. Microwave at an effective power of 250 W was charged from the microwave power source 110 by way of the waveguide 111 into the activation space (C). H radicals, etc. as the active species thus formed in the activation space (C) were introduced into the film-forming space (A). At the same time, $Si_2F_6$ gas was introduced at a flow rate of 25 sccm from the reservoir 112 into the quartz 121 heated to and maintained at 700° C., and $SiF_2$ radicals as the precursor formed in the activation space (B) were introduced into the film-forming space (A).

Further, $CF_4$ gas was introduced at a flow rate of 3.5 sccm from the gas reservoir 123 into the quartz tube 125, and RF power at 50 W was charged from the RF power source 126. $CF_2$ radicals formed as the precursor in the activation space (D) were introduced into the film-forming space (A).

Thus, a p-type A-SiC:H:F film was deposited to a film thickness of 150 Å as the p-type semiconductor layer on the i-type A-SiC:H:F film.

Successively, the p-type semiconductor layer 505, the transparent electrode 506 and the collector electrode 507 were formed by the same procedures as those in Example 6, to prepare the photoelectromotive force device 500, and characteristics as the photoelectromotive force device were evaluated in the same manner as in Example 6.

As a result, the initial values were 1.12 V for Voc and 1.8 mA/cm$^2$ for Isc, and the variation coefficients from the initial values for Voc and Isc after continuous 10 hours' light irradiation were within 5%. From the results, it has been found that the photoelectromotive force device prepared by the process for forming the deposited film according to the present invention had stable characteristics of high Voc and Isc and with less photodegradation.

TABLE 1

| voltage applied (V) | $-140$ | $-120$ | $-103$ | $-100$ | $-92$ | $-80$ |
|---|---|---|---|---|---|---|
| electron diffraction pattern | ring-like | ring-like | ring-like | spot | spot | spot |
| voltage applied (V) | $-60$ | $-50$ | $-40$ | $-30$ | $-20$ | $-10$ |
| electron diffraction | spot | spot | spot | spot | spot | spot |

TABLE 1-continued

| pattern voltage applied (V) | −5 | −3 | 0 | +20 | +40 | +60 |
|---|---|---|---|---|---|---|
| electron diffraction pattern | spot | ring-like | ring-like | ring-like | ring-like | ring-like |

TABLE 2

| | kind of deposited film | | |
|---|---|---|---|
| evaluated item | non-doped A-Si:H:F film | p-typed A-Si:H:F film | n-typed A-Si:H:F film |
| frequency of film-peeling (time) | 0 | 0 | 0 |
| film deposition rate (Å/sec.)* | 20.5 | 19.6 | 21.3 |
| photosensitivity ratio** | $10^{4.9}$ | $10^{4.8}$ | $10^{4.9}$ |

*, **values mentioned are the arithmetical mean values for 20 deposited film samples

TABLE 3

| | kind of deposited film | | |
|---|---|---|---|
| evaluated item | non-doped A-Si:H:F film | p-typed A-Si:H:F film | n-typed A-Si:H:F film |
| frequency of film-peeling (time) | 5 | 4 | 5 |
| film deposition rate (Å/sec.)* | 4.7 | 4.8 | 5.0 |
| photosensitivity ratio** | $10^{2.5}$ | $10^{2.9}$ | $10^{2.8}$ |

*, **values mentioned are the arithmetical mean values for 20 deposited film samples

TABLE 4

| frequency of film-peeling (time) | 0 |
|---|---|
| film deposition rate (Å/sec.)* | 10.5 |
| photosensitivity ratio** | $10^{5.0}$ |

*, **values mentioned are the arithmetical mean values for 20 deposited film samples

TABLE 5

| sample No. | 4001~4020 | 4021~4040 | 4041~4060 | 4061~4080 | 4081~4100 |
|---|---|---|---|---|---|
| voltage applied (V) | −40 | −10 | −20 | −5 | −50 |
| frequency of film-peeling (time) | 0 | 0 | 0 | 0 | 0 |
| film deposition rate (Å/sec.)* | 11.3 | 9.8 | 10.2 | 9.5 | 12.0 |
| photosensitivity ratio** | $10^{5.2}$ | $10^{4.9}$ | $10^{5.1}$ | $10^{4.9}$ | $10^{5.3}$ |
| electron diffraction pattern | all are of (110) orientation, spot | all are of (110) orientation, spot | all are of (110) orientation, spot | all are of (110) orientation, spot | all are of (110) orientation, spot |
| mean grain size (μm) | 1.1 | 0.9 | 1.0 | 0.9 | 1.2 |

*, **values mentioned are the arithmetical mean values for 20 deposited film samples

TABLE 6

| sample No. | 5001 | 5002 | 5003 | 5004 | 5005 |
|---|---|---|---|---|---|
| voltage applied (V) | −40 | −10 | −20 | −5 | −50 |
| rectification factor of diode | $5 \times 10^3$ | $1.2 \times 10^3$ | $1.5 \times 10^3$ | $1.0 \times 10^3$ | $8 \times 10^3$ |
| n value of diode | 1.23 | 1.28 | 1.26 | 1.28 | 1.20 |

What is claimed is:

1. A process for forming a silicon-containing functional deposited film on a substrate by HR-CVD method which comprises the steps of:
   (i) forming a precursor containing silicon atoms capable of contributing to the formation of a deposited film by subjecting a silicon-containing raw material gas to the action of an activation energy in an activation chamber (A) situated separately from a film forming chamber, and introducing said precursor into said film-forming chamber through a first gas supply means;
   (ii) forming an active species containing hydrogen radical chemically reactive with said precursor by subjecting $H_2$ gas to the action of an activation energy in an activation chamber (B) situated separately from said activation chamber (A) and said film-forming chamber;
   (iii) concurrently introducing said active species with said precursor into said film-forming chamber through a second gas supply means and controlling the quantitative ratio between said precursor and said active species to a value of from 10:1 to 1:10;
   (iv) chemically reacting said precursor with said active species in the vicinity of the surface of said substrate; and
   (v) simultaneously applying a D.C. negative voltage of −5 to −100 V to said substrate, thereby causing the formation of a silicon-containing functional deposited film on said substrate maintained at a desired temperature.

2. A process for forming a functional deposited film on a substrate containing silicon atoms and at least one kind of atoms selected from the group consisting of germanium atoms, carbon atoms, nitrogen atoms and oxygen atoms by HR-CVD method which comprises the steps of:
   (i) forming a precursor (a) containing silicon atoms capable of contributing to the formation of a deposited film, by subjecting a silicon-containing raw material gas to the action of an activation energy in an activation chamber (A) situated separately from a film-forming chamber;
   (ii) forming a precursor (b) containing at least one kind of atoms selected from the group consisting of germanium atoms, carbon atoms, nitrogen atoms and oxygen atoms, and not containing silicon atoms, capable of contributing to the formation of a deposited film, by subjecting a raw material gas containing at least one of said atoms to the action of an activation energy in an activation chamber (B) situated separately from said film-forming chamber and said activation chamber (A);

(iii) introducing said precursors (a) and (b) together or separately into said film forming chamber;

(iv) forming an active species containing hydrogen radical chemically reactive with said precursors (a) and (b) by subjecting $H_2$ gas to the action of an activation energy in an activation chamber (C) situated separately from any of said film-forming chamber and said activation chambers (A) and (B);

(v) concurrently introducing said active species separately from said precursors (a) and (b) into said film-forming chamber, and controlling the quantitative ratio between said active species and the sum of said precursors (a) and (b) being introduced into said film-forming chamber to a value of from 10:1 to 1:10; and (vi) chemically reacting said precursors (a) and (b) with said active species and (vii) simultaneously applying a D.C. negative voltage of $-5$ to $-100$ V to said substrate, thereby causing the formation of a functional deposited film containing silicon atoms and at least one kind of atoms selected from the group consisting of germanium atoms, carbon atom, nitrogen atoms and oxygen atoms on said substrate maintained at a desired temperature.

* * * * *

UNITED STATES PATENT AND TRADEMARK OFFICE
CERTIFICATE OF CORRECTION

PATENT NO. : 4,971,832
DATED : November 20, 1990
INVENTOR(S) : TAKAYOSHI ARAI, ET AL.

It is certified that error appears in the above-identified patent and that said Letters Patent is hereby corrected as shown below:

On Title page

Item [56] REFERENCES CITED

U.S. PATENT DOCUMENTS, "4,401,454  8/1983  Matsuo et al." should read --4,401,054  8/1983  Matsuo et al.--.

COLUMN 1

Line 41, "filmuniformity" should read --film-uniformity--.
    Line 64, "And" should read --As--.

COLUMN 2

Line 35, "other" should read --another--.
    Line 61, "gase" should read --gas--.

COLUMN 3

Line 25, "peeled" should read --be peeled--.
    Line 59, "characteristics a" should read --characteristics of a--.

COLUMN 5

Line 32, "contact each" should read --contact with each--.
    Line 67, "substrate 102" should read --substrate 103--.

COLUMN 6

Line 3, "strate 102" should read --strate 103--.
    Line 35, "106," should read --106b,--.

UNITED STATES PATENT AND TRADEMARK OFFICE
CERTIFICATE OF CORRECTION

PATENT NO. : 4,971,832
DATED : November 20, 1990
INVENTOR(S) : TAKAYOSHI ARAI, ET AL.

It is certified that error appears in the above-identified patent and that said Letters Patent is hereby corrected as shown below:

COLUMN 7

Line 9, "pressure gas 123a." should read
        --pressure gauge 123a.--.
    Line 11, "activation chamber 12" should read
        --activation chamber 125--.
    Line 19, "examples" should read --examples.--.
    Line 54, "dark electro-conductivity (od)" should read
        --dark electroconductivity (σd)--.

COLUMN 8

Line 21, "non-depod" should read --non-doped--.
    Line 22, "800 Å thickness" should read
        --8000 Å thickness--.
    Line 51, "2100 $cm^{-1}$ Further," should read
        --2100 $cm^{-1}$. Further,--.
    Line 59, "an" should read --a--.
    Line 60, "-5 to 100 V" should read -- -5 to -100 V--.

COLUMN 9

Line 30, "(H+, H+)" should read --(H+, $H_2$+)--.
    Line 38, "may" should read --many--.
    Line 40, "a" should read --an--.

COLUMN 10

Line 17, "made" should read --is made--.

UNITED STATES PATENT AND TRADEMARK OFFICE
CERTIFICATE OF CORRECTION

PATENT NO. : 4,971,832
DATED : November 20, 1990
INVENTOR(S) : TAKAYOSHI ARAI, ET AL.

Page 3 of 6

It is certified that error appears in the above-identified patent and that said Letters Patent is hereby corrected as shown below:

COLUMN 11

Line 5, "HR" should read --HR- --.
    Line 52, "Ge, C, N, O," should read --Ge, C, N, O,--.
    Line 63, "other" should read --another--.

COLUMN 12

Line 17, "$Si_u Y_{2U+2}$," should read --$Si_u Y_{2u+2}$,--.
    Line 23, "$Si_y H_x Y_y$" should read --$Si_u H_x Y_y$--.
    Line 25, "x=y+2u" should read --x+y=2u--.
    Line 27, "gasiable" should read --gasifiable--.
    Line 29, "$SiHCl_4$," should read --$SiHCl_3$,--.
    Line 37, "Ce," should read --C--.
    Line 47, "$G_u Y_{2U+2}$" should read --$Ge_u Y_{2u+2}$--.

COLUMN 13

Line 2, "greater $C_n H_{2n}$" should read --greater or $C_a H_{2n}$--.
    Line 26, "compound" should read --compounds--.
    Line 27, "containing 0" should read --containing O--.
    Line 32, "diluted" should read --being diluted--.
    Line 50, "rat" should read --rate--.

COLUMN 14

Line 20, "activation species (B), (C) and (D)" should read --activation spaces (B), (C) and (D)--.
    Line 27, "space," should read --spaces,--.
    Line 31, "periodical table" should read --periodic table--.

UNITED STATES PATENT AND TRADEMARK OFFICE
CERTIFICATE OF CORRECTION

PATENT NO. : 4,971,832
DATED : November 20, 1990
INVENTOR(S) : TAKAYOSHI ARAI, ET AL.

It is certified that error appears in the above-identified patent and that said Letters Patent is hereby corrected as shown below:

COLUMN 14

Line 35, "periodical table" should read --periodic table--.
    Line 60, "NO," should read --Mo,--.
    Line 64, "polyethyelen," should read --polyethylene,--.

COLUMN 15

Line 3, "surfaces" should read --surface--.
    Line 44, "required n-type" should read --required, n-type--.
    Line 61, "cross sectional" should read --cross-sectional--.

COLUMN 16

Line 27, "cas" should read --case--.

COLUMN 17

Line 7, "and more," should read --and, more--.
    Line 27, "turvo" should read --turbo--.
    Line 57, "A-SI:H:F film" should read --A-Si:H:F film--.

COLUMN 18

Line 52, "films" should read --film--.
    Line 60, "1 pm" should read --1 μm--.
    Line 68, "TIO film 202" should read --ITO film 202--.

UNITED STATES PATENT AND TRADEMARK OFFICE
CERTIFICATE OF CORRECTION

PATENT NO. : 4,971,832
DATED : November 20, 1990
INVENTOR(S) : TAKAYOSHI ARAI, ET AL.

Page 5 of 6

It is certified that error appears in the above-identified patent and that said Letters Patent is hereby corrected as shown below:

COLUMN 19

Line 3, "silm 205" should read --film 205--.
    Line 10, "PH" should read --$PH_3$--.
    Line 37, "and" should be deleted.
    Line 62, "semiconductor 505," should read
        --semiconductor layer 505,--.

COLUMN 20

Line 5, "I-type" should read --i-type--.
    Line 25, "A Si:H:F film." should read --A-Si:H:F film.--.
    Line 33, "comb-line" should read --comb-like--.
    Line 34, "prepare" should read --preparing--.
    Line 49, "stable" should read --had stable--.
    Line 50, "had" should be deleted.

COLUMN 21

Line 11, "wer " should read --were--.
    Line 48, "1 X $10^{-5}$ Torr," should read --1 X $10^{-6}$ Torr,--.

COLUMN 22

Line 12, "i-semiconductor" should read --i-type
        semiconductor--.
    Line 17, "1 X $10_{-6}$ Torr," should read --1 X $10^{-6}$ Torr,--.
    Line 33, "quartz 121" should read --quartz tube 121--.

UNITED STATES PATENT AND TRADEMARK OFFICE
CERTIFICATE OF CORRECTION

PATENT NO. : 4,971,832
DATED : November 20, 1990
INVENTOR(S) : TAKAYOSHI ARAI, ET AL.

Page 6 of 6

It is certified that error appears in the above-identified patent and that said Letters Patent is hereby corrected as shown below:

COLUMN 24

Line 8, "film" should read --film- --.

COLUMN 25

Line 10, "film forming" should read --film-forming--.

COLUMN 26

Line 7, "and" should be deleted.
    Line 9, "species and (vii)" should read
        --species; and ¶ (vii)--.
    Line 15, "atom," should read --atoms,--.

Signed and Sealed this

Twenty-ninth Day of December, 1992

Attest:

DOUGLAS B. COMER

Attesting Officer      Acting Commissioner of Patents and Trademarks